US010201096B2

(12) United States Patent
Hsu

(10) Patent No.: US 10,201,096 B2
(45) Date of Patent: Feb. 5, 2019

(54) ELECTRICAL CONNECTOR WITH TERMINALS MADE FROM SOLDERING BALLS

(71) Applicant: FOXCONN INTERCONNECT TECHNOLOGY LIMITED, Grand Cayman (KY)

(72) Inventor: Shuo-Hsiu Hsu, New Taipei (TW)

(73) Assignee: FOXCONN INTERCONNECT TECHNOLOGY LIMITED, Grand Cayman (KY)

( * ) Notice: Subject to any disclaimer, the term of this patent is extended or adjusted under 35 U.S.C. 154(b) by 0 days.

(21) Appl. No.: 15/622,089

(22) Filed: Jun. 14, 2017

(65) Prior Publication Data

US 2017/0359905 A1    Dec. 14, 2017

(30) Foreign Application Priority Data

Jun. 14, 2016    (TW) .............................. 105208794 U

(51) Int. Cl.
*H01R 12/00*     (2006.01)
*H05K 3/34*      (2006.01)
(Continued)

(52) U.S. Cl.
CPC ........... *H05K 3/3426* (2013.01); *H01R 9/091* (2013.01); *H01R 9/16* (2013.01); *H01R 13/405* (2013.01); *H01R 43/0256* (2013.01); *H01R 43/24* (2013.01); *H05K 3/3436* (2013.01); *H05K 7/1061* (2013.01); *H01R 12/7076* (2013.01); *H01R 12/716* (2013.01); *H05K 2201/10189* (2013.01); *H05K 2201/10674* (2013.01); *H05K 2201/10984* (2013.01); *H05K 2201/2018* (2013.01); *H05K 2203/041* (2013.01)

(58) Field of Classification Search
CPC ...... H01R 9/091; H01R 9/16; H01R 12/7076; H01R 43/0256; H05K 3/3426; H05K 2201/10189; H05K 2201/10984; H05K 2203/041
USPC .......................................................... 439/83
See application file for complete search history.

(56) References Cited

U.S. PATENT DOCUMENTS 4,433,886 A * 2/1984 Cassarly ............... H01L 23/552
257/E23.114
4,558,397 A * 12/1985 Olsson ................. H05K 3/3442
174/541
(Continued)

FOREIGN PATENT DOCUMENTS

CN         104852174 A     8/2015
TW         M403772         5/2011

*Primary Examiner* — Abdullah A Riyami
*Assistant Examiner* — Vladimir Imas
(74) *Attorney, Agent, or Firm* — Wei Te Chung; Ming Chieh Chang

(57) ABSTRACT

An electrical connector used for connecting an chip module to a printed circuit board includes an insulating housing, a number of terminals and a cover. The insulating housing includes a body portion. The terminals are insert molded in the body portion. The body portion includes an upper face and a lower face. Each of the terminals includes a first soldering portion extending upwardly beyond the upper face and a second soldering portion extending downwardly beyond the lower face. The cover covers the insulating housing. The electrical connector has a simple structure and a simple manufacturing process.

19 Claims, 5 Drawing Sheets

(51) Int. Cl.
*H01R 9/16* (2006.01)
*H01R 43/02* (2006.01)
*H01R 13/405* (2006.01)
*H01R 43/24* (2006.01)
*H05K 7/10* (2006.01)
*H01R 12/70* (2011.01)
*H01R 12/71* (2011.01)

(56) References Cited

U.S. PATENT DOCUMENTS

| | | | | |
|---|---|---|---|---|
| 4,652,973 A * | 3/1987 | Baker | ........... | H05K 7/1061 361/718 |
| 5,099,393 A * | 3/1992 | Bentlage | ........... | H01L 23/32 174/541 |
| 5,184,285 A * | 2/1993 | Murphy | ........... | H01L 23/495 257/E23.031 |
| 5,215,472 A * | 6/1993 | DelPrete | ........... | G01R 1/0483 439/331 |
| 5,221,209 A * | 6/1993 | D'Amico | ........... | G01R 1/0483 439/66 |
| 5,877,554 A * | 3/1999 | Murphy | ........... | G01R 1/0483 257/727 |
| 5,917,703 A * | 6/1999 | Murphy | ........... | H01L 23/32 165/80.2 |
| 5,973,393 A * | 10/1999 | Chia | ........... | H01L 23/3107 257/672 |
| 6,213,787 B1 * | 4/2001 | Murphy | ........... | H01R 13/187 361/767 |
| 6,644,985 B2 * | 11/2003 | Wilson | ........... | H05K 7/1007 439/83 |
| 6,672,881 B2 * | 1/2004 | Evans | ........... | H05K 7/1084 439/331 |
| 6,755,668 B2 * | 6/2004 | Copper | ........... | H01R 12/57 439/264 |
| 6,958,616 B1 * | 10/2005 | Mahoney | ........... | G01R 1/06722 324/755.05 |
| 7,114,996 B2 * | 10/2006 | Goodman | ........... | H01R 13/2421 439/700 |
| 7,220,134 B2 * | 5/2007 | Goodman | ........... | H01R 13/2421 439/70 |
| 7,293,995 B2 * | 11/2007 | Li | ........... | H01R 13/03 174/265 |
| 7,419,398 B2 * | 9/2008 | Goodman | ........... | H01R 24/84 439/284 |
| 7,435,102 B2 * | 10/2008 | Goodman | ........... | H01R 13/2421 361/813 |
| 7,476,110 B2 * | 1/2009 | Lemke | ........... | H01R 12/57 29/840 |
| 7,690,925 B2 * | 4/2010 | Goodman | ........... | H05K 7/1061 361/813 |
| 7,790,987 B2 * | 9/2010 | Kasahara | ........... | H01L 24/16 174/260 |
| 7,854,622 B1 * | 12/2010 | Ju | ........... | H05K 7/1084 439/342 |
| 7,871,274 B2 * | 1/2011 | Chiang | ........... | H05K 1/141 439/66 |
| 7,946,856 B2 * | 5/2011 | Jaeger | ........... | H01R 12/714 439/66 |
| 7,959,446 B1 * | 6/2011 | Ju | ........... | H05K 3/3436 439/71 |
| 8,500,477 B2 * | 8/2013 | Yeh | ........... | H05K 7/12 439/342 |
| 8,587,947 B2 * | 11/2013 | Yonemochi | ........... | H01L 23/4093 174/252 |
| 8,837,162 B2 * | 9/2014 | Heng | ........... | H05K 7/12 361/748 |
| 8,938,876 B2 * | 1/2015 | Heng | ........... | H05K 7/1084 29/825 |
| 8,969,734 B2 * | 3/2015 | Murphy | ........... | B23K 1/0016 174/260 |

* cited by examiner

ELECTRICAL CONNECTOR WITH TERMINALS MADE FROM SOLDERING BALLS

BACKGROUND OF THE INVENTION

1. Field of the Invention

The present invention relates to an electrical connector with terminals of specifically structure.

2. Description of Related Art

TW Patent Issued No. M403772 discloses an electrical connector with a plurality of first solder balls soldering to a printed circuit board. A chip module includes a plurality of second solder balls. The electrical connector includes a plurality of terminals each defining an upper end and a lower end. The upper end holds the second solder ball, and the lower end holds the first solder ball. The electrical connector connects the chip module to the printed circuit board by the first solder balls and the second solder balls. The electrical connector has a complicated structure.

An improved electrical connector with simple structure is desired.

SUMMARY OF THE INVENTION

Accordingly, the object of the present invention is to provide an electrical connector used for connecting a chip module to a printed circuit board (PCB). The connector comprises an insulating housing defining a receiving room for receiving the chip module therein and a mounting face confronting with the PCB; and a plurality of terminals retained in the insulating housing. The terminals comprises first soldering portions protruding in the receiving room to be soldered with the chip module and second soldering portions to the mounting face to be welding soldered with the PCB.

Other objects, advantages and novel features of the invention will become more apparent from the following detailed description when taken in conjunction with the accompanying drawings.

DETAILED DESCRIPTION OF THE PREFERRED EMBODIMENT

Reference will now be made in detail to the preferred embodiment of the present invention.

Figure 1:
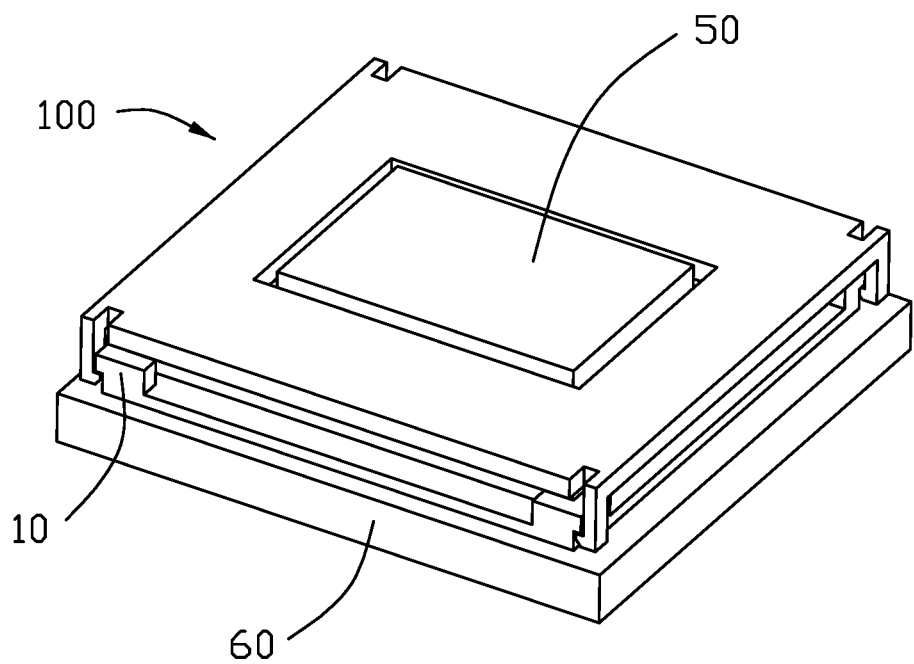
FIG. 1 is an assembled perspective view of assembly including an electrical connector, a chip module and a printed circuit board according to a preferred embodiment of the present invention.
Figure 2:
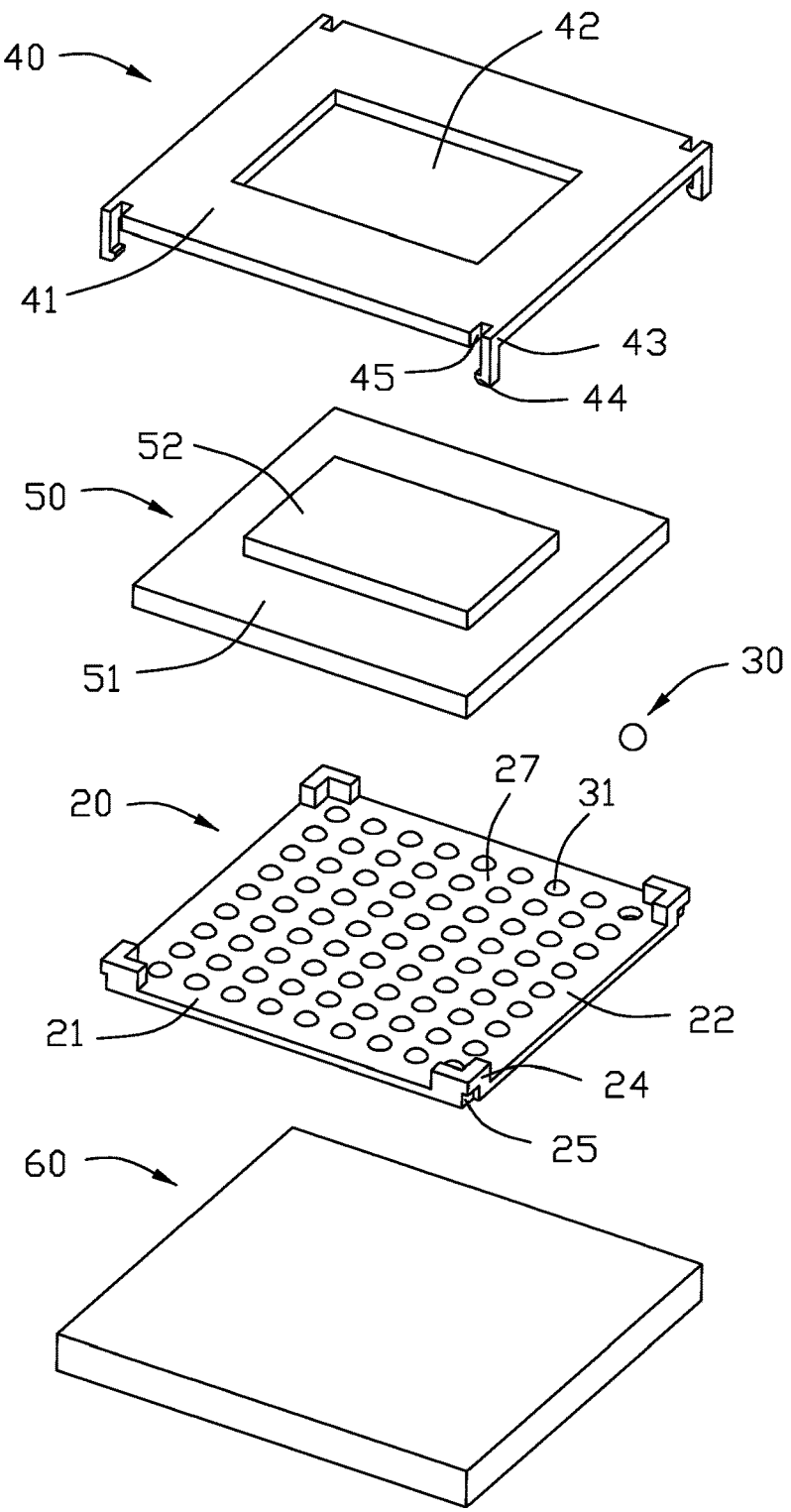
FIG. 2 is a top exploded perspective view of the assembly of FIG. 1.
Figure 3:
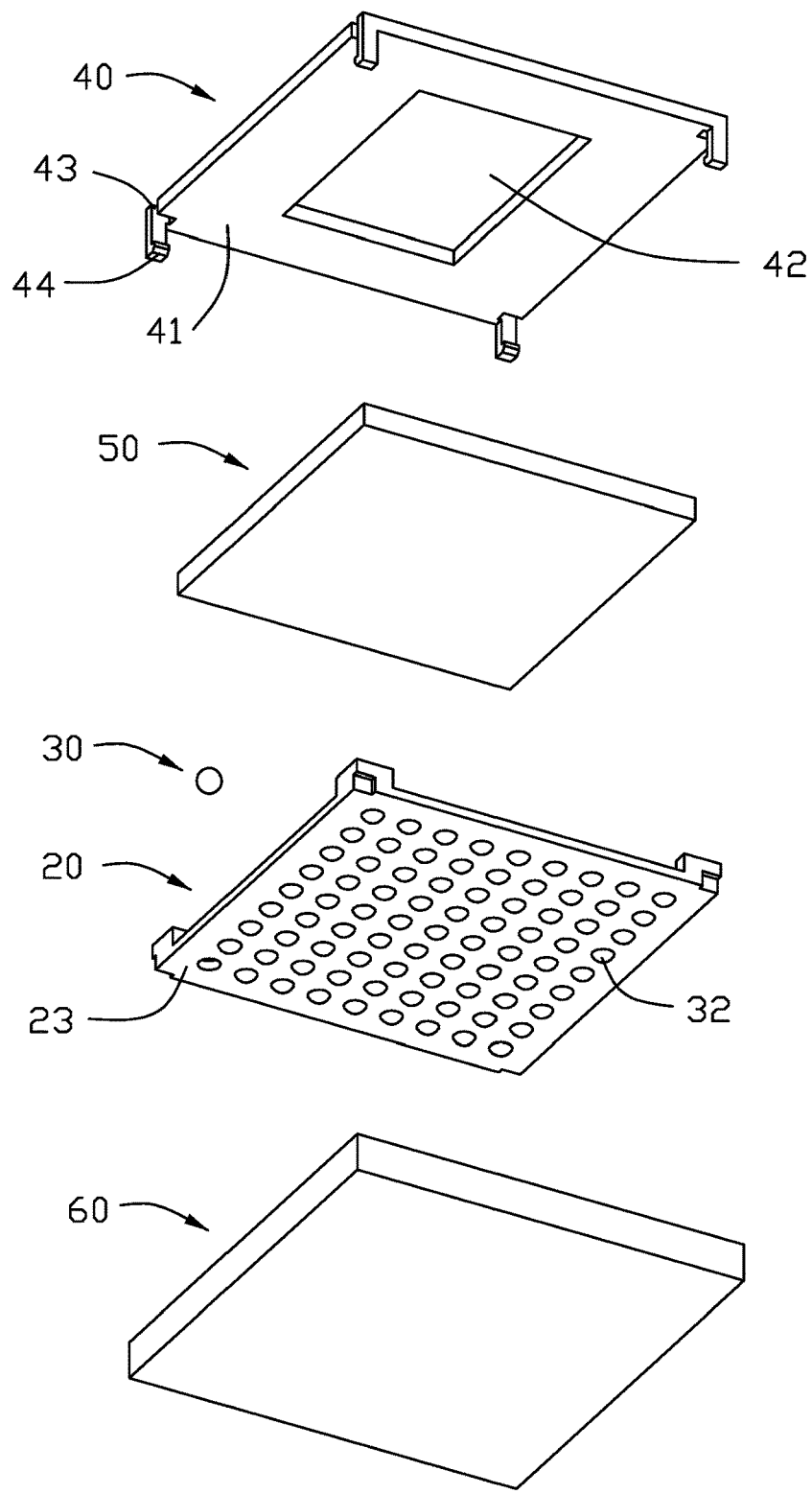
FIG. 3 is a bottom exploded perspective view of the assembly of FIG. 2.
Figure 4:
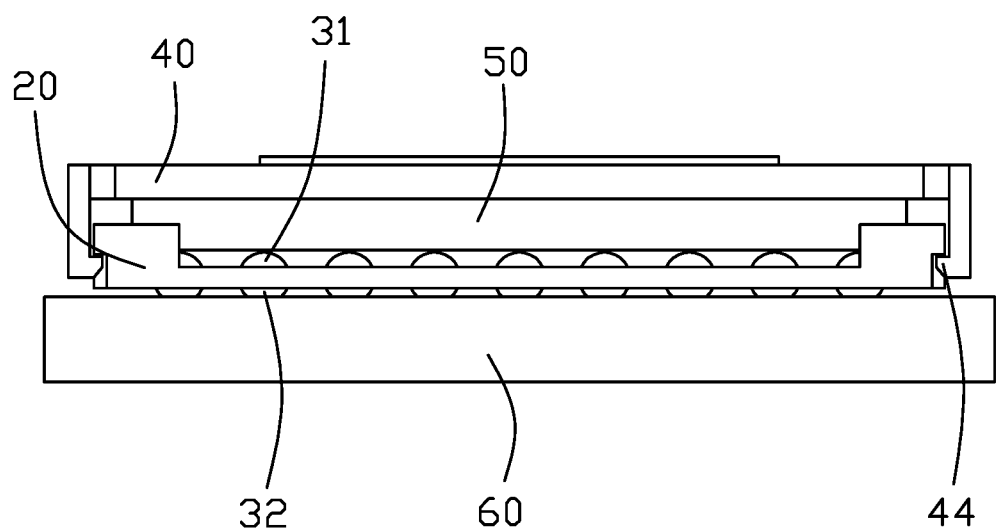
FIG. 4 is a front plan view of the assembly FIG. 1.
Figure 5:
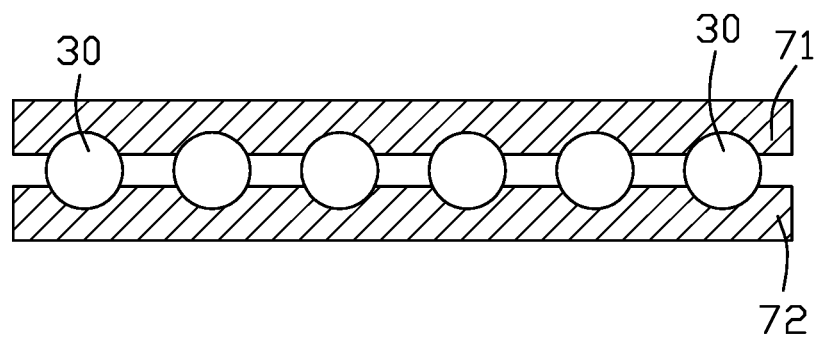
FIG. 5 is a schematic view of the terminals positioned by two boards before an insert-molding process.

Referring to FIGS. 1 to 4, an electrical connector assembly 100 includes an electrical connector 10, an insulating cover 40, a chip module 50 and a printed circuit board 60. The electrical connector 10 includes an insulating housing 20 loaded with a plurality of conductive terminals 30. The insulating housing 20 are molded on the plurality of the terminals 30 via an inserting molding process. In this preferred embodiment, the terminals 30 are made from a solder ball, which has a 95.6 percentage of tin.

The insulating housing 20 includes a body portion 21 with an upper face 22 and a lower face 23 and a plurality of upward walls 24 extending upward from the body portion 21. The upward walls 24 are disposed at four corners of the insulating housing 20, respectively. The cover are locking with the upward walls when the cover 40 is assembled on the insulating housing 20. The upward wall 24 includes a locking recess 25. The upward wall 24 is disposed as an L-shape. The terminals 30 are molded in the body portion 21. Each of the terminals 30 includes a first soldering portion 31 protruding upwardly beyond the upper face 22 and a second soldering portion 32 protruding downwardly beyond the lower face 23. The first soldering portions 31 are used for soldering to the chip module 50, the second soldering portions 32 are used for soldering to the printed circuit board 60.

The cover 40 includes a main portion 41 and a plurality of locking arms 43 extending downwardly from four corners of the main portion 41. The cover 40 defines a slot 45 at the main portion and near to the root of the locking arms 25. each of the locking arms 43 defines a barb 44 engaging with the corresponding locking recess 25. The cover 40 includes a through hole 42 in the central part of the main portion 41. The chip module 50 goes through the through hole 42. The chip module 50 includes a base 51 and a projecting portion 52 extending upwardly therefrom. The base 51 is mounted into the receiving cavity of the electrical connector. The upward wall 24 is used for restricting the base 51. The projecting portion 52 goes through the through opening 42.

An assembling of the assembly 100 is shown as below:
(1) providing two positioning molding boards 71 and 72 with positioning curved recesses/holes to have the plurality of soldering balls 30 located in the positioning holes of those positioning molding boards 71, 72; then providing resin material inserted molded with the soldering balls 30 and then forming the corresponding insulating housing 20 integrally formed with the soldering balls after cooling,
(2) putting the chip module 50 into a receiving cavity 27 defined in the insulating housing 10 among the upward walls 24 and then disposing the cover 40 on the chip module 50 and locking the cover 40 with insulating housing 20;
(3) picking up the cover 40 via the suction device imposed upon either the projecting portion 52 or upon the cover if the cover has no through hole 42 therein, to place the electrical connector 10 and the chip module 50 on the predetermined area of the PCB 60, the first soldering portions 31 are soldered with the conductive pads 53 of the chip module 50 and the second soldering portions 32 are soldered with the conductive pads 61 of the PCB 60 after the assembly reflow.

The invention includes several features. In this embodiment, the terminal 30 itself is a solder ball unitarily with soldering material thereof, rather than a discrete conductive contact equipped with the solder balls at two opposite ends of the traditional connector, thus not only reducing the height of the whole connector but also simplifying the manufacturing procedure by only one step of insert-molding process, compared with the traditional connector, of which the manufacturing steps include insert-molding the conductive contacts within the insulative housing and attaching the solder balls upon the corresponding conductive contacts by reflow. On the other hand, in the instant invention the single reflow process may simultaneously secure the terminal 30 with both the chip module 50 and the printed circuit board 60 efficiently, compared with the traditional connector requiring two reflow processes for securing to the chip module and the printed circuit board, respectively. Notably, in the instant invention the cover, which is detachable after reflow, is essentially of a plate configuration except with four locking arms 43 at four corners so as to facilitate ventilation for heat transfer, and as well the housing is also of a planar configuration except at four corners for the same consideration. However, the disclosure is illustrative only, changes may be made in detail, especially in matter of shape, size, and arrangement of sections within the principles of the invention.

What is claimed is:

1. An electrical connector used for connecting a chip module to a printed circuit board (PCB), comprising:
    an insulating housing defining a receiving room for receiving the chip module therein and a mounting face confronting with the PCB; and
    a plurality of terminals retained in the insulating housing;
    wherein the terminals comprise first soldering portions with soldering material thereof upwardly protruding in the receiving room to be soldered with the chip module, and second soldering portions with soldering material thereof downwardly protruding beyond the mounting face to be soldered with the PCB; wherein
    each of the terminals is wholly made of the soldering material.

2. The electrical connector as claimed in claim 1, wherein each of the terminals is wholly of a ball shape with an upper portion upwards beyond a bottom face of the receiving room and a lower portion downward beyond the mounting face.

3. The electrical connector as claimed in claim 1, further comprising an cover assembled on the insulating housing, wherein the insulating housing has upward walls and the cover is locked with the insulating housing.

4. The electrical connector as claimed in claim 3, wherein the cover defines locking arms, and the upward walls define locking recesses corresponding to the locking arms.

5. The electrical connector as claimed in claim 4, wherein the upward wall is disposed as an L-shape.

6. The electrical connector as claimed in claim 4, wherein the cover defines a slot at a root of each locking arm.

7. The electrical connector as claimed in claim 4, wherein the cover defines a through hole in a central part thereof for the chip module.

8. An electrical connector assembly comprising:
    a chip module;
    a printed circuit board (PCB);
    an electrical connector equipped with a plurality of terminals, each of the terminals comprising a first soldering portion and a second soldering portion both providing soldering material thereof;
    wherein the chip module is mounted upon the electrical connector and soldered with the first soldering portions of the terminals, and the electrical connector is mounted upon the PCB which is soldered with the second soldering portions of the terminals; wherein each of said terminals is wholly made of soldering material.

9. The electrical connector assembly as claimed in claim 8, wherein the electrical connector further includes an insulative housing with opposite upper and lower surfaces thereon in a vertical direction, and the terminals are integrally formed within said insulative housing via an insert-molding process, wherein the first soldering portions are exposed above the upper surface and the second soldering portions are exposed below the lower surface.

10. The electrical connector assembly as claimed in claim 9, wherein each of the terminals is wholly of a ball shape.

11. The electrical connector assembly as claimed in claim 10, wherein the first soldering portions and the second soldering portion are soldered via a same reflow process.

12. The electrical connector assembly as claimed in claim 11, further comprising a detachable cover, wherein the cover presses downwardly upon the chip module and locks with the electrical connector during the reflow process.

13. The electrical connector assembly as claimed in claim 9, wherein said housing forms a receiving cavity above the upper face, in which said chip module is disposed.

14. A method of making an electrical connector assembly comprising steps of:
    providing a pair of molding boards opposite to each other in a vertical direction, each molding board forming curved recesses therein; and
    insert-molding a plurality of solder balls within an insulative housing via an injection molding process, wherein
    the housing forms a plate with opposite upper and lower surfaces in said vertical direction, and each of said solder balls has an upper soldering portion exposed above the upper surface and a lower soldering portion exposed below the lower surface, respectively.

15. The method as claimed in claim 14, wherein further including a step of providing a chip module upon the upper surface and a printed circuit board below the lower surface to respectively secure the corresponding upper soldering portion and lower soldering portion with the chip module and the printed circuit board via a single reflow process.

16. The method as claimed in claim 15, further including a step of attaching a detachable cover upon the housing to sandwich and retain the chip module between the cover and the housing before the single reflow process.

17. The method as claimed in claim 16, wherein said cover has a planar main portion so as to cooperate with the planar housing to expose the chip module and the upper soldering portions for heat dissipation.

18. The method as claimed in claim 14, wherein said housing forms above the upper surface a receiving cavity in which the chip module is disposed.

19. The method as claimed in claim 18, wherein said receiving cavity is defined among four upward walls at four corners of the housing.

* * * * *